United States Patent [19]

Beall et al.

[11] Patent Number: 4,624,933
[45] Date of Patent: Nov. 25, 1986

[54] SODIUM FLUORMICA GLASS-CERAMICS

[75] Inventors: George H. Beall, Big Flats; Robert C. Doman, Painted Post; Linda R. Pinckney, Corning, all of N.Y.

[73] Assignee: Corning Glass Works, Corning, N.Y.

[21] Appl. No.: 811,382

[22] Filed: Dec. 20, 1985

[51] Int. Cl.⁴ .............................................. C03C 10/16
[52] U.S. Cl. ......................................................... 501/3
[58] Field of Search ............................................ 501/3

[56] References Cited

U.S. PATENT DOCUMENTS

| | | | |
|---|---|---|---|
| 3,689,293 | 9/1972 | Beall | 501/3 |
| 3,801,295 | 4/1974 | Beall et al. | 501/3 |
| 3,839,055 | 10/1974 | Grossman | 501/3 |
| 3,905,824 | 9/1975 | Grossman | 501/3 |
| 3,985,531 | 10/1976 | Grossman | 501/3 |
| 3,985,534 | 10/1976 | Flannery et al. | 501/3 |
| 4,239,519 | 12/1980 | Beall et al. | 501/3 |
| 4,239,520 | 12/1980 | Grossman | 65/33 |
| 4,559,264 | 12/1985 | Hoda et al. | 428/324 |

Primary Examiner—Mark L. Bell
Attorney, Agent, or Firm—C. S. Janes, Jr.

[57] ABSTRACT

A family of synthetic mica glass-ceramic compositions is disclosed based on a modified sodium fluoromontmorillonoid stoichiometry. These are spontaneously crystallizable glass-ceramics which are composed of 50–62% $SiO_2$, 20–28% MgO, 5–15% $Na_2O$, and 8–13% F. The method comprises supplying excess fluoride during melting to devise a synthetic mica having sodium fluoromontmorillonoid or a solid solution on the talc axis as the dominant crystal phase.

2 Claims, 1 Drawing Figure

SODIUM FLUORMICA GLASS-CERAMICS

BACKGROUND

Natural mica is notable for its unusual electrical insulating characteristics. A desire to assure a constant supply of mica material has spawned extensive research for synthetic micas.

U.S. Pat. No. 4,239,519 (Beall et al.) describes in detail several families of synthetic lithium and/or sodium mica glass-ceramics. The patent discloses that each of these families characteristically undergoes spontaneous swelling upon exposure to a polar liquid such as water. The expanded mica is easily delaminated to form a gel with the liquid.

The gel, in turn, may undergo ion exchange when exposed to certain cations larger than lithium or sodium, for example potassium ions in a salt solution. The ion-exchanged, lithium and/or sodium mica that separates is commonly referred to as floc. In accordance with the patent teaching, the latter may then be processed into paper or other desired form.

The specific teachings in the Beall et al patent are concerned primarily with lithia-containing compositions. However, the possibility of a glass-ceramic family having a sodium fluoromontmorillonoid crystal phase when crystallized is recognized.

Potassium and larger alkali metals prevent swelling of the glass-ceramics in which they occur. The lithia and lithia-soda compositions disclosed in the Beall et al. patent are technically successful, but present economic problems. In general, lithium raw materials are much more expensive than their sodium counterparts. Obviously, a composition in which the alkali metal is all sodium would be desirable from an economic point of view.

Accordingly, attention was directed toward all-soda compositions centered around the stoichiometry of sodium fluoromontmorillonoid. Spontaneous glass-ceramics resulted, but were not prone to swell in water. Hence, they did not readily undergo delamination to form a gel. It was also observed that a fluoramphibole or other type crystal phase tended to develop.

PURPOSES

It is then a primary purpose of the invention to provide novel, synthetic mica glass-ceramics that will spontaneously swell when exposed to water, and readily delaminate in the swollen state to form a gel.

A particular purpose is to provide compositions for such novel, synthetic mica glass-ceramics wherein the exchangeable ion content is essentially sodium.

Another purpose is to avoid the use of lithia-containing raw materials in the production of ion-exchangeable, synthetic mica glass-ceramics that are water-swellable.

A further purpose is to provide ion-exchanged, synthetic sodium fluormica glass-ceramics which have properties that are adapted to paper making, in particular paper used in laminated, circuit board substrates.

A still further purpose is to provide water-swellable, synthetic mica glass-ceramics based on the sodium fluoromontmorillonoid stoichiometry.

SUMMARY OF THE INVENTION

In its broadest aspect, the invention is a family of glasses that are capable of spontaneous crystallization to form uniformly crystallized, synthetic fluormica glass-ceramics having a primary crystal phase of sodium fluoromontmorillonoid or a solid solution of sodium fluoromontmorillonoid and fluoride talc. The effective composition range consists essentially of 50–62% $SiO_2$, 20–28% MgO, 5–15% $Na_2O$, and 8–13% analyzed fluorine. Preferably, the sodium fluoromontmorillonoid or solid solution is essentially the only crystal phase and residual glass is less than 5%.

For optimum water-swelling and gel-forming properties, compositions are preferably selected within the narrower range of 55–60% $SiO_2$, 23–26% MgO, 6.3–8.7% $Na_2O$, and 9–11% analyzed F.

A gel used for paper making should contain a minimum of solid materials other than the desired crystal phase. This includes both residual glass and other crystal phases such as cristobalite. To this end, optimum compositions fall within a still narrower range of 57.0–58.5% $SiO_2$, 24.3–25.3% MgO, 6.4–7.1% $Na_2O$, and 10.1–11.0% analyzed F.

The invention further contemplates a preferred method of producing the glass-ceramic which comprises drigaging the molten glass to avoid spontaneous crystallization on cooling. The glass is then reheated to cause crystallization.

PATENT LITERATURE

In addition to the Beall et al. patent (U.S. No. 4,239,519) mentioned earlier, several other U.S. patents may be of interest.

U.S. Pat. No. 4,559,264 (Hoda et al.) discloses impregnating synthetic mica papers with resin, and stacking and consolidating such papers to form a board or substrate for electronic use.

U.S. Pat. No. 3,985,531 (Grossman) discloses spontaneously-formed, fluormica glass-ceramics composed of 5–15% $Na_2O$, 10–20% MgO, 65–75% $SiO_2$, and 5–10% F, and describes a two-stage cooling schedule for crystallization. The relatively low values of MgO and F, and high $SiO_2$ content, compared to present compositions, produce non-swelling glass-ceramics.

U.S. Pat. No. 3,985,534 (Flannery et al.) discloses spontaneously-formed fluormica glass-ceramics within the $Li_2O$-$Na_2O$-$Al_2O_3$-MgO-$SiO_2$-F composition system. Each of the examples contains $Li_2O$.

U.S. Pat. No. 4,239,520 (Grossman) discloses spontaneously-formed machinable glass-ceramics which are in the $K_2O$-$Li_2O$-MgO-$SiO_2$-F composition field, and have a fluormica as the principle crystal phase.

U.S. Pat. Nos. 3,801,295 (Beall et al.) and 3,839,055 (Grossman) disclose machinable glass-ceramics wherein the dominant crystal phase is a synthetic fluormica, and the alkali metal component of the composition is potassium or a larger ion.

U.S. Pat. No. 3,905,824 (Grossman) discloses controlled orientation of fluormica or fluoramphibole crystals developed in a glass composed essentially of 25–60% $SiO_2$, 15–35% $B_2O_3$+$Al_2O_3$, 2–20% $R_2O$ which may include up to 15% $Na_2O$, 4–25% MgO, 6–25% MgO+$Li_2O$ and 4–20% F. The presence of $B_2O_3$ and/or $Al_2O_3$ tends to render the glass-ceramic glassy and nonswelling.

U.S. Pat. No. 3,689,293 (Beall) discloses glass-ceramics containing fluorophlogopite crystal phases.

GENERAL DESCRIPTION

The compositions of the present invention are based on a modification of the sodium fluoromontmorillonoid stoichiometry. As noted earlier, attempts to utilize that stoichiometry ($Na_2Mg_5Si_8O_{20}F_4$) failed to yield water-swellable glass-ceramics.

It has now been found that such failure was largely due to inadequate fluorine content. Accordingly, the desired water-swelling glass-ceramics are produced by including fluorine in excess of the stoichiometric formula, and by taking measures to minimize loss during melting.

It is well-known that fluorine tends to volatilize from a glass during melting if there are fluorides in the batch. Thus, a loss of at least 10% and up to 15% or more of the fluorine content in the batch must be expected. Higher losses occur if increased melting temperatures are employed, or if the melting unit is not covered. When fluorine content is recognized as critical, as is the case here, it is customary to chemically analyze the glass and report analyzed values for F contents.

It has been found that synthetic, ion exchangeable, fluormica glass-ceramics capable of varying degrees of water-swelling and delamination can be produced. These glass-ceramics contain sodium fluoromontmorillonoid alone or in a solid solution with fluoride talc, as their dominant crystal phase. They are composed essentially of 50-62% $SiO_2$, 20-28% $MgO$, 5-15% $Na_2O$, and 8-13% analysed fluorine.

It is, of course, desirable to employ glass-ceramics that readily expand upon exposure to water, and readily delaminate when a small force is applied. Such optimum gel-forming properties are found in materials consisting essentially of 55-60% $SiO_2$, 23-26% $MgO$, 6.3-8.7% $Na_2O$, and 9-11% analyzed F.

There is a tendency in certain materials for secondary crystal phases, such as cristobalite and amphibole, to develop. Also, substantial amounts of residual glass may be present in the glass-ceramic. The presence of such phases, foreign to the desired sodium fluoromontmorillonoid, interferes with the expansion and delamination process. It also interferes with a paper-making process and produces weak spots in the paper. Therefore, such foreign phases are minimized, and preferably do not exceed about 5% by weight.

Synthetic fluormica glass-ceramics in which the indicated extraneous phases are minimized have compositions consisting essentially of 57-58.5% $SiO_2$, 24.3-25.3% $MgO$, 6.4-7.1% $Na_2O$, and 10.1-11.0% analyzed F.

As indicated earlier, the stoichiometric formula for sodium fluoromontmorillonoid may be represented as, $$Na_2Mg_{2.5}\square_{0.5}(Si_4O_{10})F_2.$$

The corresponding composition, in parts by weight on an oxide basis is
$SiO_2$: 61.0
$MgO$: 15.3
$MgF_2$: 15.8
$Na_2O$: 7.9

Assuming formation of a few percent cristobalite, but negligible residual glass, the stoichiometry for the presently preferred compositions may be expressed as approximating $$(\square_{0.5}Na_{0.5})(Mg_{2.75}\square_{0.25})Si_4O_{10}F_2$$

This is essentially a solid solution between sodium fluoromontmorillonoid and fluoride talc. The open boxes represent vacancies in the cation sites of the crystal.

Talc may be represented as ($\square$) $Mg_3Si_4O_{10}F_2$, and is expressed in parts by weight as,
$SiO_2$: 62.7
$MgO$: 21.0
$MgF_2$: 16.3

Talc has not been synthesized in the fluoride form. The solid solutions believed to characterize the present invention tend to be near the sodium fluoromontmorillonoid end of the axis.

The composition ranges of the invention tend to be quite critical, and small changes may have substantial effects. Thus, the potassium ion and other large alkali metal ions must be avoided, since they interfere with swelling and delamination. High silica contents favor other crystal phases such as cristobalite, while increasing $MgO$ or F at the expense of $SiO_2$ minimizes such other phases. An intermediate $Na_2O$ level seems to stabilize the glass and minimize silica devitrification and residual glass formation during crystallization.

As indicated earlier, the fluorine content is critical in obtaining the desired water-swelling and delaminating characteristics. Lithia need not be excluded, but the lack of any need for this alkali metal oxide is a feature of the invention. Other oxides, such as $B_2O_3$, $Al_2O_3$, or $CaO$, tend to produce other crystal phases, or residual glass, either of which is undesirable. Therefore, we prefer compositions limited to the four basic constituents in the proportions indicated.

It is a particular feature of the present materials that the parent glass batches may be mixed from relatively inexpensive raw materials. These include talc and sodium silicofluoride, while avoiding lithiacontaining minerals.

In producing the new materials, an initial glass batch is melted for about four hours at a temperature of about 1425° C. There is a choice of procedures for handling the molten glass. Thus, it may be fusion cast, that is poured in a mold and cooled. The glass spontaneously crystallizes to a mica glass-ceramic as it cools. Alternatively, the molten glass may be drigaged, that is rapidly chilled as by pouring into water. This produces a glass which crystallizes when reheated to a suitable temperature.

The fusion casting procedure has the virtue of simplicity. However, it does not permit the control and reproducibility achieved when a glass is crystallized during a reheating step. Therefore, we prefer the drigage procedure.

The drigaged glass must be reheated to a temperature in the range of 800°-1000° C. to cause crystallization of the mica phase. The heat treatment applied to the glass is very significant in determining properties in the mica glass-ceramic. This includes the heating rate, the maximum temperature reached, and the time that the glass is held at that temperature. Obviously, routine experimentation will be necessary to optimize any given material and set of conditions.

In general, longer ceramming times and higher ceramming temperatures are preferred. However, the temperature must be held below values at which other phases develop.

The heating rate is a key factor in controlling grain size in the mica crystal phase. Grain size in turn controls gelling and paper-making characteristics.

Too fine-grained a crystal phase has inferior flocculation properties, as well as a tendency to water swell after being processed by ion exchange. A rapid heating rate produces fewer nucleating centers and hence, a coarser-grained mica. This provides a better ultimate paper product. We have found optimum heat treatment to include a rapid heating rate to a temperature of 875°–900° C. This is followed by a hold of 6–8 hours at the maximum temperature, and then cooling.

SPECIFIC DESCRIPTION

In developing the invention, glass batches were formulated on the basis of commonly available, glass-making raw materials including sand, carbonates, and fluorides. These were not critical, and other glass making materials, capable of providing the required oxides and fluoride in the indicated proportions, might have been used. Contamination with potassium, or other large alkali metal ions, must be avoided of course.

In formulating batches, the fluoride content was provided by magnesium fluoride ($MgF_2$), sodium silicofluoride ($Na_2SiF_6$), or a combination of the two materials. Fluorine retention during melting may vary widely depending on melting conditions.

Batch ingredients were ballmilled together to assist in attaining a homogeneous melt. Each ball-milled batch was placed in a platinum crucible, the crucible covered, and the batch melted in an electrically-heated furnace. The batch was held in the furnace at about 1425° C. for about four hours to produce a fluid melt having a viscosity of about ten poises. With these indicated precautions, fluorine loss during melting was limited to less than 10% by weight. This was indicated by chemical analyses made on the melts corresponding to compositions 7 and 12 of TABLE II infra, the $SiO_2$ content being calculated by difference.

|         | 7     | 12    |
|---------|-------|-------|
| $Na_2O$ | 6.63  | 7.06  |
| MgO     | 27.0  | 26.6  |
| F       | 10.3  | 10.0  |
| $SiO_2$ | 56.07 | 56.34 |

Each melt was drigaged by pouring the molten glass into cold water. This quenched the melt so that no crystallization occurred. The glass was then converted to a synthetic fluormica glass-ceramic by thermal treatment at 875°–900° C. for 6–8 hours.

TABLE I lists several glass compositions, expressed in weight percent on an oxide basis as calculated from the batch, that are illustrative of the present invention. Since it is not known with which cation(s) the fluorine is combined, it is merely reported as fluoride (F).

TABLE I

|         | 1    | 2    | 3    | 4    | 5    | 6    |
|---------|------|------|------|------|------|------|
| $SiO_2$ | 52.4 | 61.8 | 59.9 | 59.1 | 59.1 | 57.3 |
| MgO     | 22.1 | 20.2 | 22.8 | 22.5 | 23.6 | 22.3 |
| $Na_2O$ | 13.5 | 7.6  | 8.2  | 8.3  | 7.8  | 9.6  |
| $F_2$   | 12.0 | 10.4 | 9.1  | 10.1 | 9.4  | 10.8 |

Test pieces were secured from each melt for cerammming and subsequent determination of water swelling characteristics, crystal phase development, and stability under thermal treatment. Crystal phases present after an eight hour heat treatment at 875° C. were observed by x-ray measurements as a measure of stability.

Glass-ceramics corresponding to these compositions provide the benefits of the invention to a degree, but must be regarded as less than optimum. More specifically, the glass-ceramics of TABLE I tend to exhibit excess glass, cristobalite and/or amphibole phase(s). As compared to the preferred compositions of TABLE II infra, higher $Na_2O$ contents favor residual glass formation, while lower MgO contents favor cristobalite formation. As fluorine content is decreased, an amphibole phase is favored.

Table II lists several additional glass compositions, which illustrate preferred embodiments of the invention. These are also expressed in parts by weight on an oxide basis as calculated from the batch and were formulated, batched, melted, and drigaged as described earlier. Inasmuch as the sum of the ingredients closely approximates 100, for all practical purposes, the recited values can be deemed to reflect weight percent.

TABLE II

|         | 7    | 8    | 9    | 10   | 11   | 12   |
|---------|------|------|------|------|------|------|
| $SiO_2$ | 57.5 | 58.1 | 58.4 | 58.1 | 58.0 | 57.6 |
| MgO     | 25.0 | 24.5 | 24.2 | 24.5 | 24.8 | 25.0 |
| $Na_2O$ | 6.4  | 6.9  | 7.1  | 6.7  | 6.6  | 6.8  |
| $F_2$   | 10.9 | 10.4 | 10.1 | 10.7 | 10.7 | 10.7 |

A test piece of glass from each melt was subjected to a crystallization temperature of 800° C. for 4 hours. Similar test pieces were also exposed at 875° C. for 8 hours. The longer, higher temperature treatment tends to produce a coarser crystallization which is more desirable in paper making. However, it may also favor production of other phases, such as cristobalite or amphibole, if the mica is not thermally stable.

TABLE III shows the crystal phase development observed after heat treatment. It also sets forth the gelling behavior of the glass-ceramics. In all cases, the primary phase was sodium fluoromontmorillonoid, or a solid solution of that phase with fluoride talc. When a secondary phase was observed, it was usually cristobalite, although amphibole development could also occur. The glass-ceramic of Example 7 showed some residual glass. Material that resisted delamination and gelling appeared as a residue, and consisted primarily of cristobalite, amphibole, and/or glass phases. Residue varied from "slight" which was no more than 1–2% and barely discernible, to "much" which might be as great as half in a strongly heated, relatively unstable material.

TABLE III

|                   | 7                            | 8                    | 9                    | 10                     | 11                     | 12                     |
|-------------------|------------------------------|----------------------|----------------------|------------------------|------------------------|------------------------|
| 800° C. - 4 hrs   |                              |                      |                      |                        |                        |                        |
| Primary           | mica                         | mica                 | mica                 | mica                   | mica                   | mica                   |
| Secondary         | minor                        | very minor           | minor                | none                   | none                   | none                   |
| 875° C. - 8 hrs   |                              |                      |                      |                        |                        |                        |
| Primary           | mica                         | mica                 | mica                 | mica                   | mica                   | mica                   |
| Secondary         | glass and minor              | mod.                 | mod.                 | mod.                   | mod.                   | minor                  |
| Gelling Rate      | slow much residue            | fast residue         | fast residue         | fast minor residue     | fast minor residue     | fast slight residue    |

Note: mod. means moderate.

It was noted earlier that residual glass in a synthetic mica glass-ceramic interferes with, and can completely negate, the swelling that characteristically occurs when the glass-ceramic is contacted with a polar liquid. This is illustrated in the accompanying drawing which corresponds to FIG. 2 of U.S. Pat. No. 3,985,531 (Grossman). The drawing is a replica electron micrograph showing the etched surface of a synthetic mica body produced in accordance with the patent and "wherein the residual glass is seen as depressed regions due to its greater solubility in the etchant used." The synthetic micas of the patent are disclosed as being composed of 5-15% $Na_2O$, 10-20% MgO, 65-75% $SiO_2$ and 5-10% F.

For comparison purposes, a set of two melts of the Grossman patent composition 4, and a corresponding set of melts of the Example 12 composition, were prepared under melting conditions as prescribed in the patent. One melt of each set was cast in a slab mold and cooled. The other melt in each set was drigaged, that is quenched by pouring into a container of cold water.

Each cast melt spontaneously crystallized upon cooling. The melt of the patent formed an opal slab that was brittle and appeared to be an impervious, solid body. X-ray traces showed a primary crystal phase of cristobalite.

In contrast, the molded body corresponding to composition 12 had a very porous, or spongy, appearance, particularly in the interior. When cut, it tended to crumble so that it was impractical to produce a suitable surface for a replica micrograph.

The drigaged melts took the form of fragmented or granular glass in each case. Each glass was given a eight hour heat treatment at 875° C. to convert it to the glass-ceramic state.

A ten gram sample of each glass-ceramic was placed in a beaker, and 100 ml. of deionized water added while stirring. The material of the patent remained as hard white granules and the water remained clear. When the water was decanted and the residue dried and weighed, it was found no change in weight had occurred. This indicated no disintegration and gel formation. In contrast, the material of example 12 formed a thick milky white gel. A barely perceptible residue in the bottom of the beaker could not readily be segregated for weighing. This indicated almost total gelation.

We claim:
1. A family of glass-ceramic compositions having as a principal crystal phase a sodium fluoromontmorillonoid phase or a solid solution of the sodium fluoromontmorillonoid and fluoride talc, wherein the glass-ceramic undergoes swelling upon exposure to water and may be readily delaminated to form a gel, the parent glasses being capable of spontaneous crystallization on cooling and consisting essentially, on a calculated chemical bases, of 55-60% $SiO_2$, 23-26% MgO, 6.3-8.7% $Na_2O$, and 9-11% analyzed F, and being essentially potassium-free and lithium-free.

2. A family of glass-ceramic compositions in accordance with claim 1 wherein the glass-ceramic does not contain over about 5% of residual glass and/or any crystal phase other than sodium fluoromontmorillonoid or a solid solution of sodium montmorillonoid and fluoride talc, the family consisting essentially of, on a calculated chemical basis, 57.0-58.5% $SiO_2$, 24.3-25.3% MgO, 6.4-7.1% $Na_2O$, and 10.1-11.0% analyzed F.

* * * * *